(12) United States Patent
Kennedy et al.

(10) Patent No.: US 8,889,334 B2
(45) Date of Patent: *Nov. 18, 2014

(54) SPIN-ON ANTI-REFLECTIVE COATINGS FOR PHOTOLITHOGRAPHY

(71) Applicant: Honeywell International Inc., Morristown, NJ (US)

(72) Inventors: Joseph T Kennedy, San Jose, CA (US); Teresa Baldwin-Hendricks, Livermore, CA (US)

(73) Assignee: Honeywell International Inc., Morristown, NJ (US)

( * ) Notice: Subject to any disclaimer, the term of this patent is extended or adjusted under 35 U.S.C. 154(b) by 12 days.

This patent is subject to a terminal disclaimer.

(21) Appl. No.: 13/692,444

(22) Filed: Dec. 3, 2012

(65) Prior Publication Data

US 2013/0164677 A1 Jun. 27, 2013

Related U.S. Application Data

(63) Continuation of application No. 10/495,688, filed as application No. PCT/US01/45306 on Nov. 15, 2001, now Pat. No. 8,344,088.

(60) Provisional application No. 60/335,264, filed on Nov. 15, 2001.

(51) Int. Cl.
*G03F 7/00* (2006.01)
*G03F 7/11* (2006.01)
*G03F 7/075* (2006.01)

(52) U.S. Cl.
USPC .................. 430/270.1; 430/271.1; 430/273.1

(58) Field of Classification Search
USPC .................. 430/270.1, 271.1, 273.1; 428/447
See application file for complete search history.

(56) References Cited

U.S. PATENT DOCUMENTS 2,986,549 A 5/1961 McLoughlin
3,547,766 A 12/1970 Chu
(Continued)

FOREIGN PATENT DOCUMENTS

JP 6158788 A 3/1986
JP 2001092122 A * 4/2001

OTHER PUBLICATIONS

Sigma-Aldrich, Product Specification, Alphazurine A—Die Content 40%, one page downloaded from Sigma-aldrich.com on Feb. 22, 2014, one page.

(Continued)

*Primary Examiner* — Amanda C. Walke
(74) *Attorney, Agent, or Firm* — Faegre Baker Daniels LLP

(57) ABSTRACT

Anti-reflective coating materials for ultraviolet photolithography include at least one absorbing compounds and at least one pH tuning agent that are incorporated into spin-on materials. Suitable absorbing compounds are those that absorb around wavelengths such as 365 nm, 248 nm, 193 nm and 157 nm that may be used in photolithography. Suitable pH tuning agents not only adjust the pH of the final spin-on composition, but also influence the chemical performance and characteristics, mechanical performance and structural makeup of the final spin-on composition that is part of the layered material, electronic component or semiconductor component, such that the final spin-on composition is more compatible with the resist material that is coupled to it. A method of making absorbing and pH tuned spin-on materials includes combining at least one organic absorbing compound and at least one pH tuning agent with at least one silane reactant during synthesis of the spin-on materials and compositions.

31 Claims, 7 Drawing Sheets

(56) References Cited

U.S. PATENT DOCUMENTS

| | | | |
|---|---|---|---|
| 4,107,133 A | 8/1978 | Sawai et al. | |
| 4,302,503 A | 11/1981 | Mattimoe | |
| 4,590,117 A | 5/1986 | Taniguchi et al. | |
| 5,082,758 A | 1/1992 | Hoffend et al. | |
| 5,204,432 A | 4/1993 | Saito et al. | |
| 5,319,049 A | 6/1994 | Yoshioka et al. | |
| 5,415,927 A | 5/1995 | Hirayama et al. | |
| 5,460,911 A | 10/1995 | Yu et al. | |
| 6,210,856 B1* | 4/2001 | Lin et al. | 430/270.1 |
| 6,268,457 B1* | 7/2001 | Kennedy et al. | 528/39 |
| 6,770,327 B2 | 8/2004 | Edelmann et al. | |
| 6,846,568 B2 | 1/2005 | Yamaya et al. | |
| 2002/0061453 A1* | 5/2002 | Sato et al. | 430/5 |
| 2003/0214042 A1 | 11/2003 | Miyazawa | |
| 2005/0225238 A1 | 10/2005 | Yamazaki | |

OTHER PUBLICATIONS

Pigment Green 7, 15832-14-5, Chemical Book obtained from Google search the page is http://www.chemicalbook.com/ChemicalProductProperty_EN_CB399460.htm and was downloaded on Feb. 20, 2014, 3 pages.

Xu et al, "Absorption and Exciton Emission by an Aggregated Cyanine Dye Occluded within Mesoporous SBA-15", J. Phys. Chem. B, vol. 106, 2002, pp. 1991-1994, published on line Jan. 29, 2002.

\* cited by examiner 2-hydroxy-4-(3-triethoxysilylpropoxy)-
diphenylketone
10

2-hydroxy-4-(3-trimethoxysilylpropoxy)-
diphenylketone
11

2-hydroxy-4-(3-tributoxysilylpropoxy)-
diphenylketone
12

2-hydroxy-4-(3-tripropoxysilylpropoxy)-
diphenylketone
13 rosolic acid
14 triethoxysilylpropyl-1,8-naphthalimide
15 trimethoxysilylpropyl-1,8-naphthalimide
16 tripropoxysilylpropyl-1,8-naphthalimide
17

10-phenanthrene carboxy-methyl
triethoxysilane
29

10-phenanthrene carboxy-ethyl
triethoxysilane
30

10-phenanthrene carboxy-methyl
trimethoxysilane
31

10-phenanthrene carboxy-propyl
triethoxysilane
32

4-phenylazophenol
33

4-ethoxyphenylazobenzene-4-carboxy
methyl triethoxysilane
34

4-methoxyphenylazobenzene-4-carboxy
ethyl triethoxysilane
35

**4-ethoxyphenylazobenzene-4-carboxy
propyl triethoxysilane
36**

**4-butoxyphenylazobenzene-4-carboxy
propyl triethoxysilane
37**

**4-methoxyphenylazobenzene-4-carboxy
methyl triethoxysilane
38**

**4-ethoxyphenylazobenzene-4-carboxy
methyl triethoxysilane
39**

**4-methoxyphenylazobenzene-4-carboxy
ethyl triethoxysilane
40**

4-methoxyphenylazobenzene-4-carboxy
propyl triethoxysilane
41

SPIN-ON ANTI-REFLECTIVE COATINGS FOR PHOTOLITHOGRAPHY

This application is a continuation of U.S. application Ser. No. 10/495688 entitled "Spin-On Anti-Reflective Coatings for Photolithography" and filed on Nov. 17, 2004, which is a National Stage Application of PCT/US01/45306 and a nonprovisional application based on U.S. application Ser. No.: 60/335264, all of which are commonly-owned and incorporated herein by reference in their entirety.

FIELD OF THE INVENTION

The present invention relates generally to spin-on glass materials and more specifically to light-absorbing spin-on glass materials for use as anti-reflective layers in photolithography and methods of producing the materials.

BACKGROUND OF THE INVENTION

To meet the requirements for faster performance, the characteristic dimensions of features of integrated circuit devices have continued to be decreased. Manufacturing of devices with smaller feature sizes introduces new challenges in many of the processes conventionally used in semiconductor fabrication. One of the most important of these fabrication processes is photolithography.

It has long been recognized that linewidth variations in patterns produced by photolithography can result from optical interference from light reflecting off an underlying layer on a semiconductor wafer. Variations in photoresist thickness due to the topography of the underlying layer also induce linewidth variations. Anti-reflective coatings (ARC) applied under a photoresist layer have been used to prevent interference from reflection of the irradiating beam. In addition, anti-reflective coatings partially planarize the wafer topography, helping to improve linewidth variation over steps because the photoresist thickness is more uniform.

Organic polymer films, particularly those that absorb at the i-line (365 nm) and g-line (436 nm) wavelengths conventionally used to expose photoresists, and at the recently used 157 nm, 193 nm, 248 nm wavelengths, have been employed or are being tested as anti-reflective coatings. However, the fact that the organic ARC's share many chemical properties with the organic photoresists can limit usable process sequences. Furthermore, ARC's, including both organic and inorganic ARC's, may intermix with photoresist layers. Organic and inorganic ARC's can mix with photoresist layers if they are not sufficiently baked or cured.

One solution to avoid intermixing is to introduce thermosetting binders as additional components of organic ARC's, as described for example in U.S. Pat. No, 5,693,691 to Flaim et al. Dyes may also be incorporated in organic ARC's, as well as, optionally, additional additives such as wetting agents, adhesions promoters, preservatives, and plasticizers, as described in U. S. Pat. No. 4,910,122 to Arnold et al. Even though these previous patents may address some of the issues with intermixing, the problem of the lack of 86- to 90-degree uniformity on the resist edges because of the coupled ARC layer has not been addressed in the prior art.

Photoresists and anti-reflective coatings can also influence one another to the extent that the chemical properties of the anti-reflective coating and/or the resist material can lead the resist to "fall over" once a pattern has been developed into the resist. In other words, the patterned resist sidewall can't maintain an approximate 90-degree angle with respect to the anti-reflective coating after photoresist developing. Instead the resist will take on a 120-degree or an 80-degree angle with respect to the anti-reflective coating. These imperfections are also an indication that photoresist materials and anti-reflective coatings are not necessarily chemically, physically or mechanically compatible.

Another class of materials that can be used as an anti-reflective layer is spin-on-glass (SOG) compositions containing a dye. Yau et al., U.S. Pat. No. 4,587,138, disclose a dye such as basic yellow #11 mixed with a spin-on-glass in an amount approximately 1% by weight. Allman et al. U.S. Pat. No. 5,100,503 disclose a cross-linked polyorganosiloxane containing an inorganic dye such as $TiO_2$, $Cr_2O_7$, $MnO_4$, or $ScO_4$, and an adhesion promoter. Allman additionally teaches that the spin-on-glass compositions also serve as a planarizing layer. However, the spin-on-glass, dye combinations that have been disclosed to date are not optimal for exposure to the deep ultraviolet, particularly 248 and 193 nm, light sources that are coming into use to produce devices with small feature sizes. Furthermore, not all dyes can be readily incorporated into an arbitrary spin-on-glass composition. Also, even though these ARC's are chemically different than the previously mentioned organic ARC's, the coupled resist layers can still suffer from "falling over" after being developed, as based on the chemical, physical, and mechanical incompatibility of the ARC layer and the resist layer—which is a common problem when trying to couple resist materials and an reflective coatings.

Therefore, an absorbing spin-on-glass anti-reflective coating and lithography material that a) absorbs strongly and uniformly in the ultraviolet spectral region, b) can keep the resist material from "falling over" and expanding outside of the intended resist line, and c) would be impervious to photoresist developers and methods of production of the SOG anti-reflective coating described would be desirable to advance the production of layered materials, electronic components and semiconductor components.

SUMMARY OF THE INVENTION

An anti-reflective coating material for ultraviolet photolithography comprises at least one organic absorbing compound and at least one pH tuning agent that are incorporated into a spin-on-inorganic or spin-on glass (SOG) material.

The spin-on materials comprise inorganic-based compounds, such as those that are silicon-based, gallium-based, arsenic-based, boron-based or a combination of those inorganic elements and materials. Some contemplated spin-on glass materials may comprise methylsiloxane, methylsilsesquioxane, phenylsiloxane, phenylsilsesquioxane, methylphenylsiloxane, methylphenylsilsesquioxane, silicate polymers and mixtures thereof. As used herein, the group known as "spin-on-glass materials" also comprises siloxane polymers, hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about four. Also included are copolymers of hydrogensilsesquioxane and alkoxyhydridosiloxane or hydroxyhydridosiloxane. Spin-on-glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than zero and the sum of n and m is greater than about four and R is alkyl or aryl.

Absorbing compounds suitable for incorporation into the spin-on-glass materials are strongly absorbing at wavelength less than 375 nm or less than about 260 nm. In particular, suitable absorbing compounds are around wavelengths such as 248 nm, 193 nm, 157 nm or other ultraviolet wavelengths, such as 365 nm, that may be used in photolithography. The chromophores of suitable compounds typically have at least one benzene ring, and in those instances where there are two or more benzene rings, those rings may or may not be fused. Incorporatable absorbing compounds have an accessible reactive group attached to the chromophore, wherein the reactive groups can include hydroxyl groups, amine groups, carboxylic acid groups, and substituted silyl groups with silicon bonded to one, two, or three alkoxy group or halogen atom substituents. The reactive groups may be directly bonded to the chromophore or the reactive groups may be attached to the chromophore through a hydrocarbon bridge or an oxygen linkage. The chromophores may also comprise silicon-based compounds or polymers similar to those used to formulate the spin-on glass materials.

The pH tuning agent is a compound, material or solution that is added to the mixture of the spin-on material and the organic absorbing compound in part to "tune" or adjust the pH of the final spin-on composition such that the final spin-on composition is more compatible with the coupled resist layer or other coupled layers. It should be appreciated, however, that the pH tuning agent not only adjusts the pH of the final spin-on composition, but it also influences the chemical performance and characteristics, mechanical performance and structural makeup of the final spin-on composition that is part of the layered material, electronic component or semiconductor component, such that the final spin-on composition is more compatible with the resist material that is coupled to it. More specifically, the pH tuning agent strong influences the polymeric characteristics, the structural makeup and the spatial orientation that results in increasing the surface properties of the anti-reflective coating for optimal resist performance. In other words, a pH tuning agent that merely adjusts the pH of the spin-on material without influencing the mechanical properties and structural makeup of the spin-on composition or the coupled resist material is not contemplated herein.

According to another aspect of the present invention, methods for synthesizing absorbing spin-on compositions are provided. Spin-on materials are conventionally synthesized from silane and silicon-based reactants such as triethoxysilane, tetraethoxysilane, methyltriethoxysilane, dimethyldiethoxysilane, tetramethoxysilane, methyltrimethoxysilane, trimethoxysilane, dimethyldimethoxysilane, phenyltriethoxysilane, phenyltrimethoxysilane, diphenyldiethoxysilane, and diphenyldimethoxysilane. However, gallium, arsenic, germanium, boron and similar atoms and materials may also be used in conjunction with silicon atoms or as the sole atomic material to produce a spin-on material. Halosilanes, particularly chlorosilanes are also used as silane reactants.

A method of making an absorbing spin-on composition includes combining at least one inorganic-based composition, at least one incorporatable organic absorbing compound, at least one pH tuning agent, an acid/water mixture, such as a nitric acid/water mixture, and at least one solvent to form a reaction mixture; and refluxing the reaction mixture to form the absorbing spin-on composition. The spin-on composition formed is then diluted with at least one solvent to provide coating solutions that produce films of various thicknesses. The pH tuning agent may also and alternatively be added during the refluxing step or after the refluxing step.

In another method of making an absorbing spin-on composition, at least one inorganic-based composition, at least one incorporatable organic absorbing compound, at least one pH tuning agent, and at least one solvent can be combined to form a reaction mixture. The reaction mixture is then refluxed to form the absorbing spin-on composition. The spin-on composition formed is diluted with at least one solvent to provide coating solutions that produce films of various thicknesses. The pH tuning agent in this method may either be a variation of the conventional acid/water mixture, in that a different acid may be added, less acid may be added, or more water may be added. Regardless of the pH tuning agent chosen, however, the basic principal still remains—which is that not only the pH is influenced by the pH tuning agent, but the chemical, mechanical and physical properties of the ARC are also influenced resulting in a more compatible resist/ARC couple.

In yet another aspect of the present invention, an absorbing spin-on composition is produced comprising at least one silicon-based compound, at least one incorporatable organic absorbing compound that absorbs light at wavelengths less than about 375 nm, and a pH tuning agent. Further provided are absorbing spin-on compositions, wherein at least one of the silicon-based compounds or the incorporatable organic absorbing compound comprises at least one alkyl group, alkoxy group, ketone group or azo group.

According to yet another aspect of the invention, spin-on compositions comprising the absorbing compounds of the chemical class comprising 9-anthracene carboxy-alkyl trialkoxysilane are provided. A method of synthesizing any one of the 9-anthracene carboxy-alkyl trialkoxysilanes includes combining 9-anthracene carboxylic acid, chloroalkyltrialkoxysilane, triethylamine, and a solvent to form a reaction mixture; refluxing the reaction mixture; cooling the refluxed reaction mixture to form a precipitate and a remaining solution; and filtering the remaining solution to produce liquid 9-anthracene carboxy-alkyl trialkoxysilane.

DETAILED DESCRIPTION

Figure 1A:
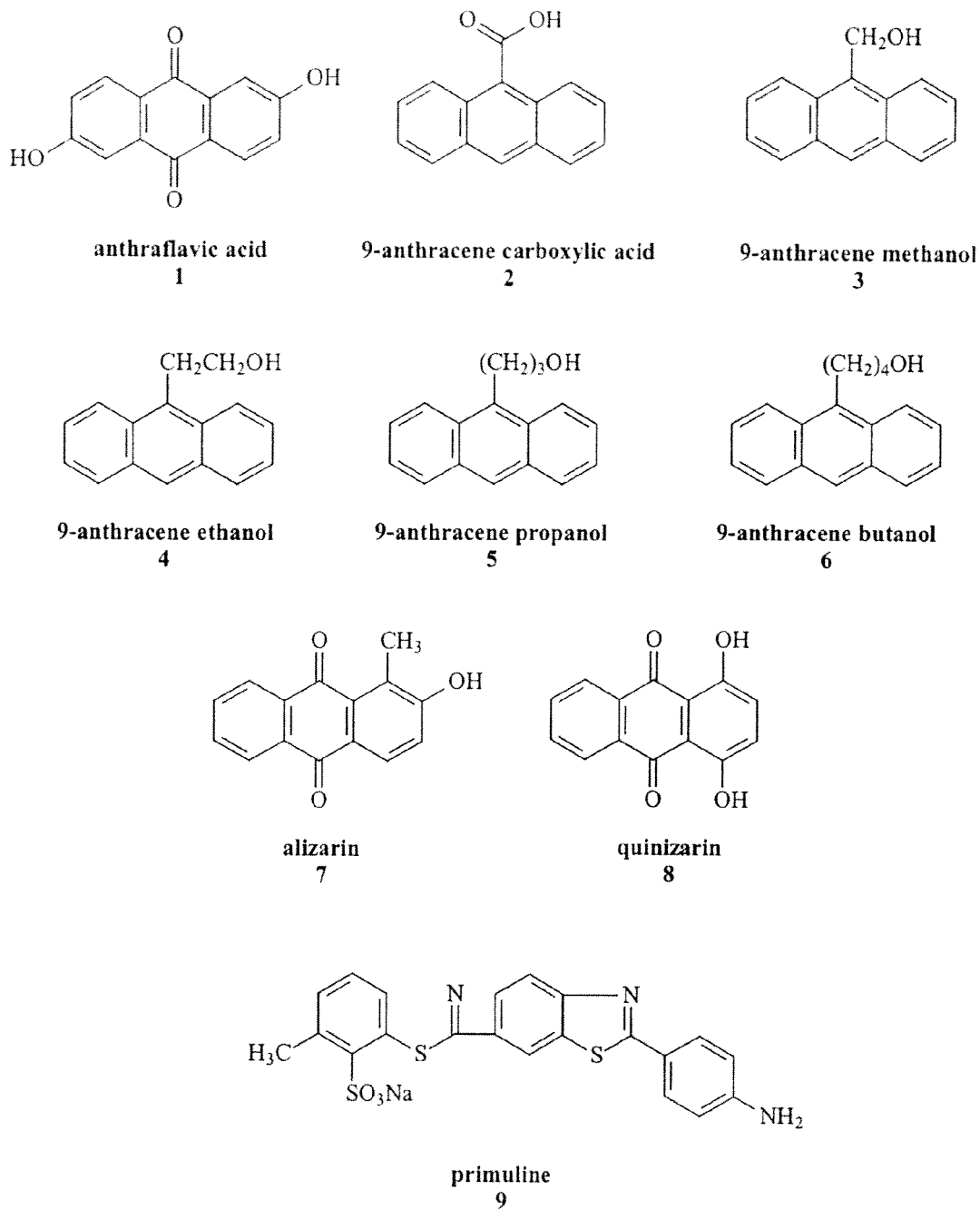
FIGS. 1a-1f show the chemical formulas of absorbing compounds incorporated into spin-on-glass compositions.
Figure 1B:
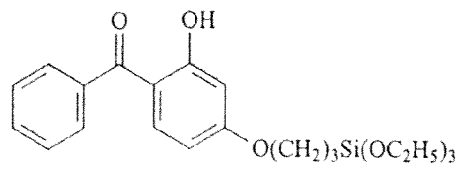
Figure 1B:
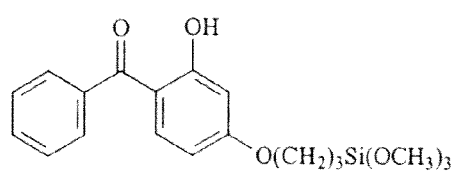
Figure 1B:
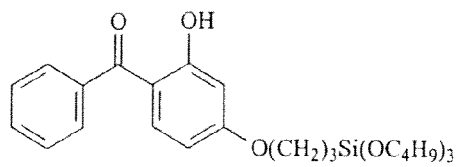
Figure 1B:
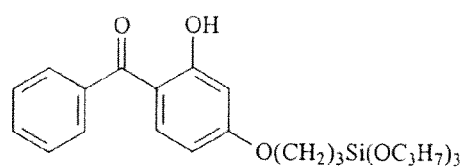
Figure 1B:
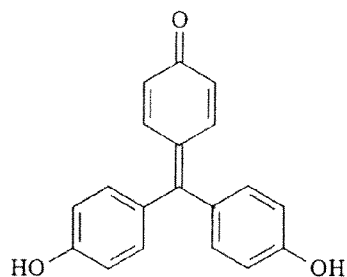
Figure 1B:
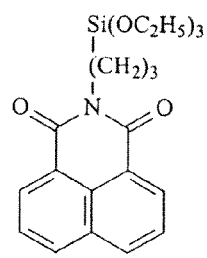
Figure 1B:
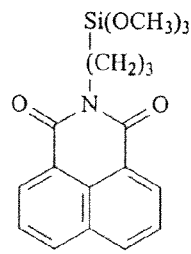
Figure 1B:
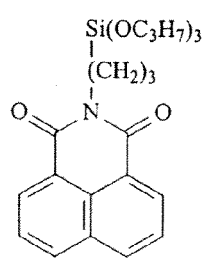
Figure 1C:
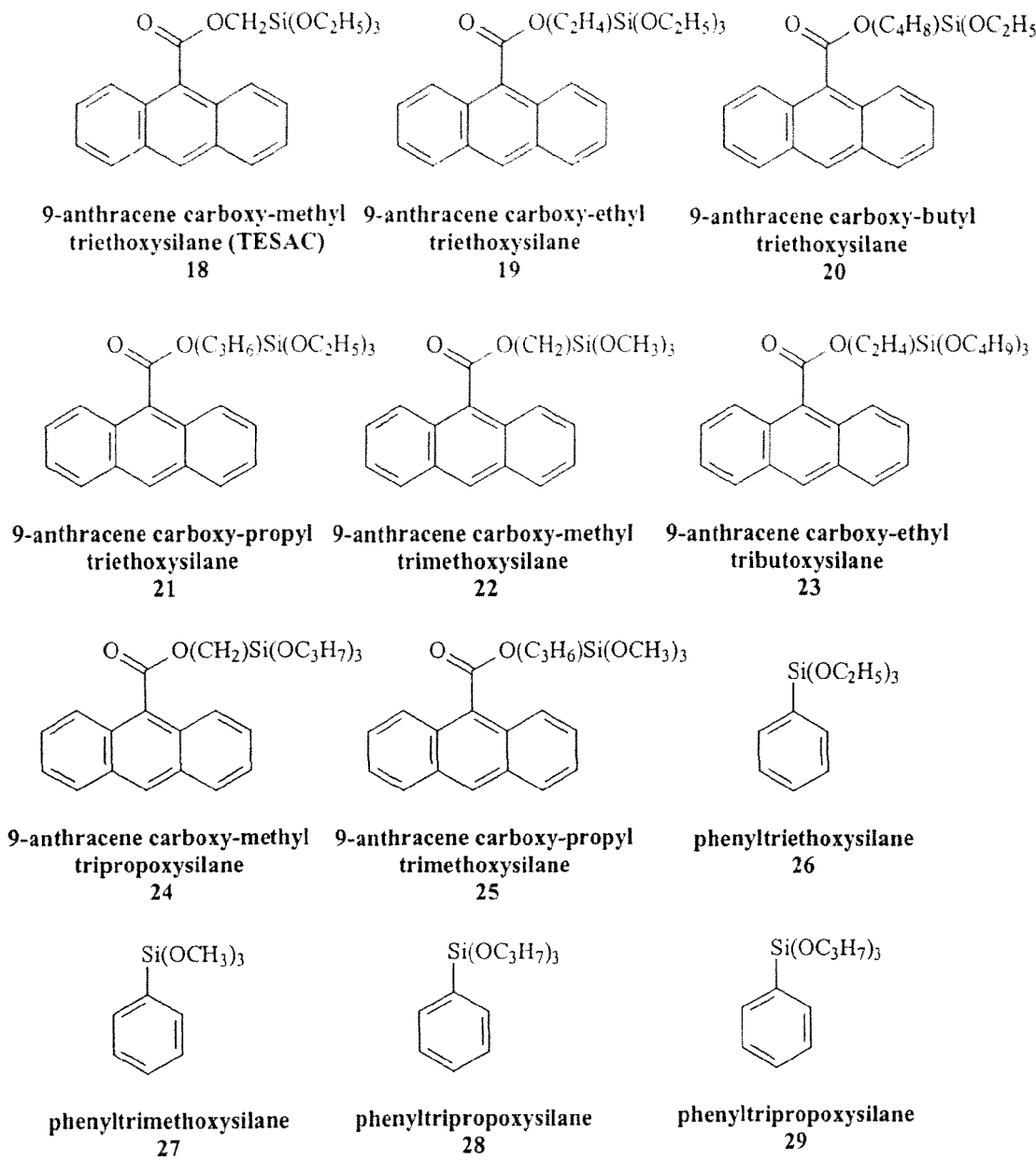
Figure 1D:
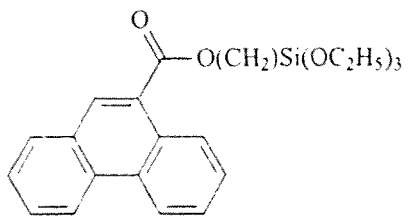
Figure 1D:
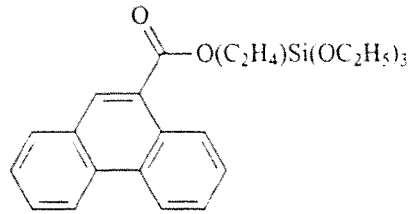
Figure 1D:
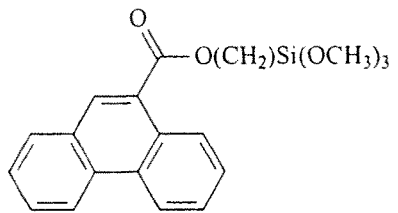
Figure 1D:
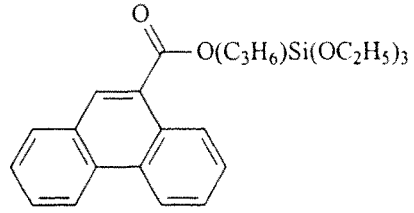
Figure 1D:
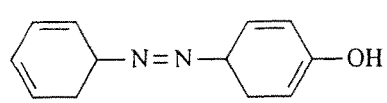
Figure 1D:
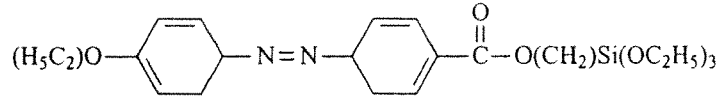
Figure 1D:
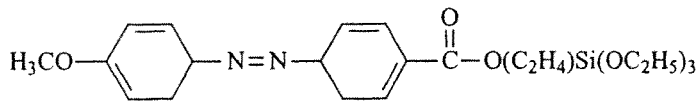
Figure 1E:
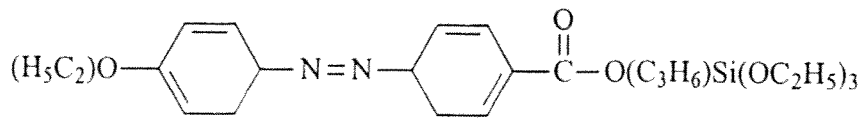
Figure 1E:
Figure 1E:
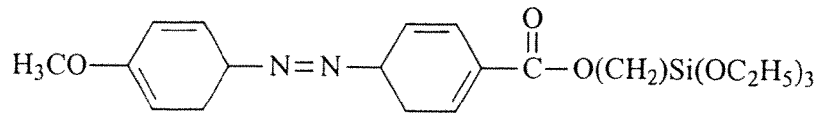
Figure 1E:
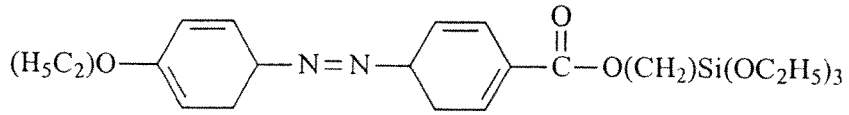
Figure 1E:
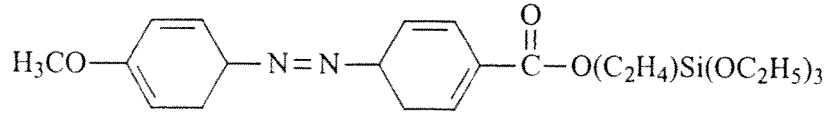
Figure 1F:
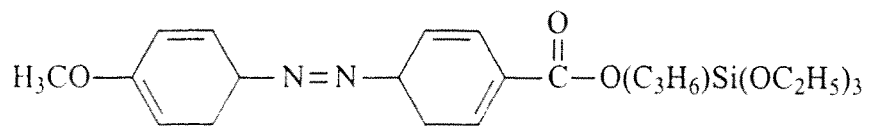

An anti-reflective coating material for ultraviolet photolithography includes at least one organic absorbing compound and at least one pH tuning agent incorporated into a spin-on inorganic or spin-on-glass (SOG) material. The absorbing spin-on compositions are dissolved in appropriate solvents to form coating solutions and applied to various layers of materials in fabricating layered materials, electronic devices, and semiconductor devices. The absorbing spin-on anti-reflective coatings are designed to be readily integrated into existing layered material, electronic component or semiconductor fabrication processes. Some properties that facilitate integration include a) developer resistance, b) thermal stability during standard photoresist processing, and c) selective removal with respect to underlying layers.

Spin-On Material

Contemplated spin-on materials comprise inorganic-based compounds, such as silicon-based, gallium-based, germanium-based, arsenic-based, boron-based compounds or combinations thereof. As used herein, the phrases "spin-on material", "spin-on organic material", "spin-on composition" and "spin-on inorganic composition" may be used interchangeable and refer to those solutions and compositions that can be spun-on to a substrate or surface. It is further contemplated that the phrase "spin-on-glass materials" refers to a subset of "spin-on inorganic materials", in that spin-on glass materials refer to those spin-on materials that comprise silicon-based compounds and/or polymers in whole or in part. Examples of silicon-based compounds comprise siloxane compounds, such as methylsiloxane, methylsilsesquioxane, phenylsiloxane, phenylsilsesquioxane, methylphenylsiloxane, methylphenylsilsesquioxane, silazane polymers, silicate polymers and mixtures thereof. A contemplated silazane polymer is perhydrosilazane, which has a "transparent" polymer backbone where chromophores can be attached.

As used herein, the phrase "spin-on-glass materials" also includes siloxane polymers and blockpolymers, hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about four. Also included are copolymers of hydrogensilsesquioxane and an alkoxyhydridosiloxane or hydroxyhydridosiloxane. Spin-on glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than zero and the sum of n and m is greater than about four and R is alkyl or aryl. Some useful organohydridosiloxane polymers have the sum of n and m from about four to about 5000 where R is a $C_1$-$C_{20}$ alkyl group or a $C_6$-$C_{12}$ aryl group. The organohydridosiloxane and organohydridosilsesquioxane polymers are alternatively denoted spin-on-polymers. Some specific examples include alkylhydridosiloxanes, such as methylhydridosiloxanes, ethylhydridosiloxanes, propylhydridosiloxanes, t-butylhydridosiloxanes, phenylhydridosiloxanes; and alkylhydridosilsesquioxanes, such as methylhydridosilsesquioxanes, ethylhydridosilsesquioxanes, propylhydridosilsesquioxanes, t-butylhydridosilsequioxanes, phenylhydridosilsesquioxanes, and combinations thereof.

Absorbing Compound

Many naphthalene-, phenanthrene- and anthracene-based compounds have significant absorption at 248 nm and below. Benzene-based, equivalently termed here phenyl-based, compounds have significant absorption at wavelengths shorter than 200 nm. While these naphthalene-, anthracene-, phenanthrene- and phenyl-based compounds are frequently referred to as dyes, the term absorbing compound is used here because the absorptions of these compounds are not limited to wavelengths in the visible region of the spectrum. However, not all such absorbing compounds can be incorporated into spin-on materials for use as anti-reflective coating materials. Absorbing compounds suitable for use with the present invention have a definable absorption peak centered around wavelengths such as 248 nm, 193 nm, 157 nm or other ultraviolet wavelengths, such as 365 nm, that may be used in photolithography. It is contemplated that a preferred "definable absorption peak" is one that is at least 1 nm in width, wherein width is calculated by those methods commonly known in the art of photolithography. In more preferred embodiments, the definable absorption peak is at least 5 nm in width. In even more preferred embodiments, the definable absorption peak is at least 10 nm in width.

The chromophores of suitable absorbing compounds typically have at least one benzene ring, and where there are two or more benzene rings, the rings may or may not be fused. Incorporatable absorbing compounds have an accessible reactive group attached to the chromophore, wherein the reactive groups include hydroxyl groups, amine groups, carboxylic acid groups, and substituted silyl groups with silicon bonded to one, two, or three "leaving groups," such as alkoxy groups or halogen atoms. Ethoxy or methoxy groups or chlorine atoms are frequently used as leaving groups. Preferable reactive groups comprise siliconalkoxy, silicondialkoxy and silicontrialkoxy groups, such as siliconethoxy, silicondiethoxy, silicontriethoxy, siliconmethoxy, silicondimethoxy, and silicontrimethoxy groups and halosilyl groups, such as chlorosilyl, dichlorosilyl, and trichlorosilyl groups.

The reactive groups may be directly bonded to the chromophore, as, for example, in phenyltriethoxysilane, or the reactive groups may be attached to the chromophore through an oxygen linkage or a hydrocarbon bridge, as, for example, in 9-anthracene carboxy-alkyl trialkoxysilane. The inclusion of silicontrialkoxy groups on chromophores has been found to be advantageous, especially for promoting stability of the absorbing SOG films. Other useful absorbing compounds are those compounds that contain an azo group, —N=N—, and an accessible reactive group, particularly those containing an azo group linking benzene rings, especially when absorption around 365 nm is desired for the particular application. Azo groups may be included as part of a straight-chain molecule, a cyclic molecule or a hybrid straight-chain/cyclic molecule.

The absorbing compounds may be incorporated interstitially in the spin-on material matrix. The absorbing compounds may also be chemically bonded to the spin-on material or polymer. In some contemplated embodiments, the incorporatable absorbing compounds form bonds with the spin-on material backbone or polymer backbone via the accessible reactive groups.

Absorbing spin-on compositions and materials may also comprise a silicon-based compound and an incorporatable organic absorbing compound that absorbs light at wavelengths less than about 375 nm. Further, it is contemplated that in other embodiments at least one of the silicon-based compound or the incorporatable organic absorbing compound comprises at least one alkyl group, alkoxy group, ketone group or azo group.

Examples of absorbing compounds suitable for use with the present invention include anthraflavic acid (1), 9-anthracene carboxylic acid (2), 9-anthracene methanol (3), 9-anthracene ethanol (4), 9-anthracene propanol (5), 9-anthracene butanol (6), alizarin (7). quinizarin (8), primuline (9), 2-hydroxy-4-(3-triethoxysilylpropoxy)-diphenylketone (10), 2-hydroxy-4-(3-trimethoxysilylpropoxy)-diphenylketone (11), 2-hydroxy-4-(3-tributoxysilylpropoxy)-diphenylketone (12), 2-hydroxy-4-(3-tripropoxysilylpropoxy)-diphenylketone (13), rosolic acid (14), triethoxysilylpropyl-1,8-naphthalimide (15), trimethoxysilylpropyl-1,8-naphthalimide (16), tripropoxysilylpropyl-1,8-naphthalimide (17), 9-anthracene carboxy-methyl triethoxysilane (18), 9-anthracene carboxy-ethyl triethoxysilane (19), 9-anthracene carboxy-butyl triethoxysilane (20), 9-anthracene carboxy-propyl triethoxysilane (21), 9-anthracene carboxy-methyl trimethoxysilane (22), 9-anthracene carboxy-ethyl tributoxysilane (23), 9-anthracene carboxy-methyl tripropoxysilane (24), 9-anthracene carboxy-propyl trimethoxysilane (25), phenyltriethoxysilane (26), phenyltrimethoxysilane (27), phenyltripropoxysilane (28), 10-phenanthrene carboxy-methyl triethoxysilane (29), 10-phenanthrene carboxy-ethyl triethoxysilane (30), 10-phenanthrene carboxy-methyl trimethoxysilane (31), 10-phenanthrene carboxy-propyl triethoxysilane (32), 4-phenylazophenol, (33), 4-ethoxyphenylazobenzene-4-carboxy-methyl triethoxysilane (34), 4-methoxyphenylazobenzene-4-carboxy-ethyl triethoxysilane (35), 4-ethoxyphenylazobenzene-4-carboxy-propyl triethoxysilane (36), 4-butoxyphenylazobenzene-4-carboxy-propyl triethoxysilane (37), 4-methoxyphenylazobenzene-4-carboxy-methyl triethoxysilane (38), 4-ethoxyphenylazobenzene-4-carboxy-methyl triethoxysilane (39), 4-methoxyphenylazobenzene-4-carboxy-ethyl triethoxysilane (40), 4-methoxyphenylazobenzene-4-carboxy-propyl triethoxysilane (41), and combinations, thereof. Chemical formulas of absorbing compounds 1-41 are illustrated in FIGS. 1a-1f. Advantageous results have been obtained, for example, with 9-anthracene carboxy-methyl triethoxysilane (18) with combinations of 9-anthracene methanol (3), 2-hydroxy-4-(3-triethoxysilylpropoxy)-diphenylketone (10), and rosolic acid (14), and with phenyltriethoxysilane (26). It should be appreciated, however, that this list of specific compounds is not an exhaustive list, and that contemplated and preferred compounds can be selected from the chemical compound classes that comprise these specific compounds.

Absorbing compounds 1-25 and 29-41 are available commercially, for example, from Aldrich Chemical Company (Milwaukee, Wis.). 9-anthracene carboxy-alkyl trialkoxysilanes are synthesized using esterification methods, as described below in the Examples Section. Absorbing compound 26-28 is available commercially from Gelest, Inc. (Tullytown, Pa.). Examples of phenyl-based absorbing compounds in addition to absorbing compound (26-28), many of which are also commercially available from Gelest, Inc., include structures with silicon-based reactive groups attached to phenyl rings or to substituted phenyls, such as methylphenyl, chlorophenyl, and chloromethylphenyl. Specific phenyl-based absorbing compounds include phenyltrimethoxysilane, benzyltrichlorosilane, chloromethylphenyltrimethoxysilane, phenyltrifluorosilane, to name only a few examples. Diphenyl silanes including one or two "leaving groups," such as diphenylmethylethoxysilane, diphenyldiethoxysilane, and diphenyldichlorosilane, to again name only a few examples, are also suitable incorporatable absorbing compounds. Alkoxybenzoic acids may also be used as absorbing compounds, including methoxybenzoic acid.

A general method of synthesizing 9-anthracene carboxy-alkyl trialkoxysilane compounds comprises using 9-anthracene carboxylic acid and a chloromethyl trialkoxysilane compound as reactants. Specifically, a method of synthesizing 9-anthracene carboxy-methyl triethoxysilane (18) uses 9-anthracene carboxylic acid (2) and chloromethyl triethoxysilane as reactants. The reactants are combined with triethylamine and methylisobutylketone (MIBK), previously dried over 4 Å molecular sieves, to form a reaction mixture which is heated to reflux and refluxed for from approximately 6 to 10 hours. After reflux, the reaction mixture is cooled overnight leading to a large quantity of solid precipitate. The remaining solution is roto-evaporated, filtered through a silica gel column, and roto-evaporated a second time, to produce 9-anthracene carboxy-methyl triethoxysilane (18) as a dark amber oily liquid, which may be purified. This method is significant because it is suitable to use to produce any compound in the class of 9-anthracene carboxy-alkyl trialkoxysilanes, including 9-anthracene carboxy-ethyl triethoxysilane, 9-anthracene carboxy-propyl trimethoxysilane, and 9-anthracene carboxy-propyl triethoxysilane.

pH Tuning Agent

The pH tuning agent is a compound, material or solution that is added to the mixture of the spin-on material and the organic absorbing compound in order to "tune" or adjust the pH of the final spin-on composition so that it is compatible or more compatible with any chosen resist material, including those with absorption peaks around 365 nm, 248 nm, 193 nm and 157 nm.

It should be appreciated, however, that the pH tuning agent not only adjusts the pH of the final spin-on composition, but it also influences the chemical performance and characteristics, mechanical performance and structural makeup of the final spin-on composition that is part of the layered material, electronic component or semiconductor component, such that the final spin-on composition is more compatible with the resist material that is coupled to it. More specifically, the pH tuning agent strongly influences the polymeric characteristics, the structural makeup and the spatial orientation that results in increasing the surface properties of the anti-reflective coating for optimal resist performance. In other words, a pH tuning agent that merely adjusts the pH of the spin-on material without influencing the mechanical properties and structural makeup of the spin-on composition or the coupled resist material is not contemplated herein.

Contemplated pH tuning agents must perform two separate and sometimes related functions: a) to influence the pH of the composition to which it is being added; and b) to influence the mechanical performance and/or structural makeup of the spin-on composition, which can also been stated as strongly influencing the polymeric characteristics, the structural makeup and the spatial orientation that results in increasing the surface properties of the anti-reflective coating for optimal resist performance.

Contemplated pH tuning agents are partly designed to influence the pH of the composition to which it is added. The class of potential pH tuning agents comprises a) any suitable acidic or basic solution, compound, and/or component and/or b) any suitable strength or concentration of an acidic or basic solution, compound and/or component. This compilation of suitable pH "influencers" is the larger set of compound from which the ultimate pH tuning agent is chosen, because the pH "influencer" must also be able to influence the mechanical performance and/or structural makeup of the final spin-on composition while also making the final spin-on composition compatible or more compatible. By this, for example, it is meant that the chosen pH tuning agent is also designed to match the solubility parameter, the molecular weight, the melting point or some other physical characteristic of the spin-on material and organic absorbing compound mixture. In other words, the pH tuning agent and the mixture of spin-on material and organic absorbing compound cannot be physically incompatible, depending on the desirable physical characteristic, even if the pH tuning agent performs its first function of influencing the pH of the mixture. In preferred embodiments, the desirable physical characteristic is the solubility parameter or the molecular weight. In more preferred embodiments, the desirable physical characteristic is the solubility parameter.

It is also contemplated that the pH tuning agent will also mechanically and structurally influence the performance and characteristics of the resist material/ARC couple. For example, a pH tuned spin-on composition is applied to a substrate or layered material, and then a resist material is applied to the spin-on composition. When the resist material is exposed and subsequently developed will have an 85-90 degree angle with respect to the spin-on composition (a development line). In other words, the resist material will not "fall over" onto the spin-on composition, but instead will have a useful development line. In the case where the spin-on composition is not pH tuned, the resist material may "fall over" onto the spin-on composition after etching, which obviously leads a defective resist material and/or to a defective layered material. It is in this instance where the pH tuned spin-on composition influences the mechanical and structural integrity of the final spin-on composition and the compatibility of the resist material/ARC couple. As used herein, the terms "coupled" or "couple" mean that the two materials or compositions are juxtaposed on top of one another to the point where the two materials are physically, mechanically and/or chemically bonded to one another.

Examples of some suitable pH tuning agents comprise various molar concentrations of the class of amines, such as γ-aminoalkyltrialkoxysilanes, specifically γ-aminopropyltriethoxysilanes (APTF or APTEOS); water; oxides and alkoxides, such as sodium alkoxides, potassium alkoxides, potassium hydroxide; hydrogen halides, such as hydrogen bromide, hydrochloric acid; acetic acid; sulfuric acid, lactic acid, nitric acid; TMAH; propylene glycol methyl ether acetate (PGMEA); amine-based oligomers, including those oligomers with inorganic atoms such as silicon, and combinations thereof. Contemplated molar concentrations of the pH tuning agent include pure, 10 Molar, 1.0 Molar, 0.1 Molar and 0.01 Molar concentrations, depending on the pH agent chosen for the resist material.

Contemplated resist materials may comprise any photolithographic resist materials, including those that have wavelength ranges around 157 nm, 193 nm, 248 nm and 365 nm. The major reason that the class of resist materials is so broad is that the pH tuning agent makes it possible to match any photolithographic resist material with an anti-reflective coating and make them compatible with one another. Examples of some contemplated photolithographic resist materials comprise acrylate-based resist materials, epoxy-based chemically amplified resists, fluoropolymer resists (which are especially useful when contemplating a 157 nm absorption wavelength), poly(norbornene-maleic anhydride) alternating co-polymers, polystyrene systems and diazonaphthoquinone/novolac resist Methods of Production According to another aspect of the present invention, methods for synthesizing the absorbing spin-on compositions described herein are provided. Spin-on materials are typically synthesized from a variety of silane reactants including, for example, triethoxysilane (HTEOS), tetraethoxysilane (TEOS), methyltriethoxysilane (MTEOS), dimethyldiethoxysilane, tetramethoxysilane (TMOS), methyltrimethoxysilane (MTMOS), trimethoxysilane, dimethyldimethoxysilane, phenyltriethoxysilane (PTEOS), phenyltrimethoxysilane (PTMOS), diphenyldiethoxysilane, and diphenyldimethoxysilane. However, gallium, arsenic, germanium, boron and similar atoms and materials may also be used in conjunction with silicon atoms or as the sole atomic material to produce a spin-on material.

Halosilanes, including chlorosilanes, such as trichlorosilane, methyltrichlorosilane, ethyltrichlorosilane, phenyltrichlorosilane, tetrachlorosilane, dichlorosilane, methyldichlorosilane, dimethyldichlorosilane, chlorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, and chlorophenyltrimethoxysilane are also used as silane reactants.

In general, to produce the absorbing spin-on compositions, the absorbing compounds, such as absorbing compounds 1-41, or combinations thereof, are combined with the silane reactants during the synthesis of the SOG materials. The pH tuning agent may also be combined with the silane reactants during the synthesis of the SOG materials or once the synthesis is complete.

One contemplated method of making an absorbing spin-on composition includes combining at least one inorganic-based composition, at least one incorporatable organic absorbing compound, at least one pH tuning agent, an acid/water mixture, such as a nitric acid/water mixture, and at least one solvent to form a reaction mixture; and refluxing the reaction mixture to form the absorbing spin-on composition. The spin-on composition formed is then diluted with at least one solvent to provide coating solutions that produce films of various thicknesses. The pH tuning agent may also and alternatively be added during the refluxing step or after the refluxing step.

In another contemplated method of making an absorbing spin-on composition, at least one inorganic-based composition, at least one incorporatable organic absorbing compound, at least one pH tuning agent, and at least one solvent can be combined to form a reaction mixture. The reaction mixture is then refluxed to form the absorbing spin-on composition. The spin-on composition formed is diluted with at least one solvent to provide coating solutions that produce films of various thicknesses. The pH tuning agent in this method may either be a variation of the conventional acid/water mixture, in that a different acid may be added, less acid may be added, or more water may be added. Regardless of the pH tuning agent chosen, however, the basic principal still remains—which is that not only the pH is influenced by the pH tuning agent, but the chemical, mechanical and physical properties of the ARC are also influenced resulting in a more compatible resist/ARC couple.

More specifically, a reaction mixture including silane reactants, for example HTEOS, or TEOS and MTEOS, or, TMOS and MTMOS; or, alternatively, tetrachlorosilane and methyltrichlorosilane, at least one absorbing compound, such as absorbing compounds 1-41; at least one pH tuning agent, such as APTF; a solvent or combination of solvents; and an acid/water mixture, is formed in a reaction vessel. Appropriate solvents include acetone, 2-propanol, and other simple alcohols, ketones and esters such as 1-propanol, MIBK, propoxypropanol, and propyl acetate. The acid/water mixture is, for example nitric acid and water. Other protic acids or acid anhydrides, such as acetic acid, formic acid, phosphoric acid, hydrochloric acid or acetic anhydride are alternatively used in the acid mixture. The resulting mixture is refluxed for between approximately 1 and 24 hours to produce the absorbing spin-on solution. As mentioned earlier, the pH tuning agent may be added during or after the refluxing step, depending on the resist material chosen. Also, as mentioned earlier, the acid concentration and/or strength and the water concentration in the acid/water mixture may be varied in order to become a pH tuning agent, depending on the resist material chosen for the specific layered material, electronic component or semiconductor component application.

The absorbing spin-on material can be diluted with appropriate solvents to achieve coating solutions that produce films of various thicknesses. Suitable dilutant solvents include acetone, 2-propanol, ethanol, butanol, methanol, propylacetate, ethyl lactate, and propylene glycol propyl ether, referred to commercially as Propasol-P. Dilutant solvents with high boiling points such as ethyl lactate and propylene glycol propyl ether have been found beneficial. It is believed high boiling point solvents decrease the probability of formation of bubble film defects. In contrast, lower boiling point solvents may become entrapped below a crosslinked top layer of a film and subsequently produce voids when driven off during a baking process step. Additional solvents useful in the invention include ethylene glycol dimethyl ether, alternatively termed glyme, anisole, dibutyl ether, dipropyl ether, propylene glycol methyl ether acetate, and pentanol. Optionally, surfactants, such as the product FC430, provided by 3M (Minneapolis, Minn.), or the product Megaface R08, provided by DIC (Japan), are also added to the coating solution. The coating solution is typically between about 0.5 and 20% polymer by weight. Prior to use, the coating solution is filtered by standard filtration techniques.

According to a second method of forming absorbing spin-on materials, a reaction mixture including at least one silane reactant, at least one absorbing compound, such as absorbing compounds 1-41, at least one pH tuning agent, and a solvent or combination of solvents is formed in a reaction vessel. The reaction mixture is heated to reflux and refluxed for between approximately 1 and 24 hours. The silane reactants and solvents are as described in the first method above. An acid/water mixture, as described above, is added to the reaction mixture while stirring. The resulting mixture is heated to reflux and refluxed for between approximately 1 and 24 hours to produce the absorbing and pH tuned spin-on material. The absorbing spin-on material is diluted and filtered as described above to form a coating solution. Again, as mentioned earlier, the pH tuning agent may be added during or after the first refluxing step.

A method of forming an absorbing organohydridosiloxane material includes forming a mixture of a dual phase solvent which includes both a non-polar solvent and a polar solvent and a phase transfer catalyst; adding at least one organotrihalosilane, hydridotrihalosilane; adding at least one pH tuning agent; and at least one absorbing compound, such as absorbing compounds 1-41, to provide a dual phase reaction mixture; and reacting the dual phase reaction mixture for between 1 and 24 hours to produce the absorbing organohydridosiloxane polymer. The phase transfer catalyst includes but is not limited to tetrabutylammonium chloride and benzyltrimethylammonium chloride. Exemplary non-polar solvents include, but are not limited to, pentane, hexane, heptane, cyclohexane, benzene, toluene, xylene, halogenated solvents such as carbon tetrachloride and mixtures thereof. Useful polar solvents include water, alcohols, and alcohol and water mixtures. The absorbing polymer solution is diluted and filtered as described above to form a coating solution.

Applications

The absorbing and pH tuned spin-on coating solutions are applied to various substrates to form layered materials, layers used in semiconductor processing, or layers used in electronic components, depending on the specific fabrication process, typically by conventional spin-on deposition techniques These techniques include a dispense spin, a thickness spin, and thermal bake steps, to produce an absorbing SOG anti-reflective coating. Typical processes include a thickness spin of between 1000 and 4000 rpm for about 20 seconds and two or three bake steps at temperatures between 80° C. and 300° C. for about one minute each. The absorbing and pH tuned spin-on anti-reflective coatings, according to the present invention exhibit refractive indices between about 1.3 and about 2.0 and extinction coefficients greater than approximately 0.07.

Substrates contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and it's oxides), a polymer-based packaging or board interface such as found in a polyimide-based flex package, lead or other metal alloy solder ball surface, glass and polymers such as polymimide. In more preferred embodiments, the substrate comprises a material common in the packaging and circuit board industries such as silicon, copper, glass, and another polymer.

Figure 2A:
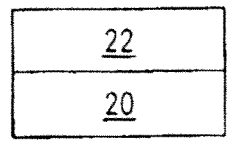
FIGS. 2a-2h illustrate the use of absorbing spin-on compositions comprising pH tuning agents as anti-reflective coating layers in a photolithography process.
Figure 2B:
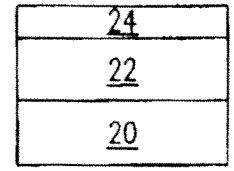
Figure 2C:
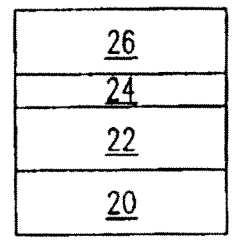
Figure 2D:
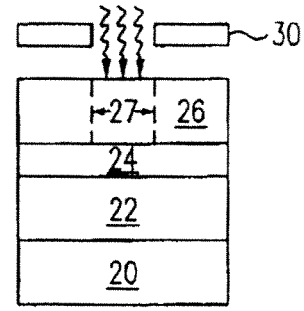

A general method of using an absorbing spin-on-glass material according to the present invention as an anti-reflective coating in a photolithographic process is illustrated in FIGS. 2a-2h. As shown in FIG. 2a, a dielectric layer 22 is deposited on a silicon substrate 20. Dielectric layer 22 can be composed of a variety of dielectric materials including, for example, a silicon dioxide layer derived from TEOS, a silane based silicon dioxide layer, a thermally grown oxide, or a chemical-vapor-deposition-produced methylhydridosiloxane or silicon dioxide incorporating other elements or compounds. Dielectric layer 22 is typically an optically transparent medium, but it does not have to be an optically transparent medium. An absorbing and pH tuned spin-on anti-reflective coating layer 24 is applied above dielectric layer 22 (FIG. 2b) that is covered by a photoresist layer 26, of a conventional positive photoresist, to produce the stack shown in FIG. 2c. The stack of FIG. 2c is exposed to ultraviolet radiation 32 through mask 30, as shown in FIG. 2d. During the exposure, the absorbing and pH tuned spin-on ARC layer 24 absorbs UV light 32 transmitted through the photoresist. Because the dielectric layer 22 is generally and usually transparent in the UV wavelength range, if absorbing spin-on ARC layer 24 were not present, the UV light 32 would reflect off the underlying silicon layer 20 degrading a critical dimension, for example critical dimension 27 of the exposed photoresist. In this example, a positive photoresist, which provides direct image transfer, is assumed. It should be appreciated, however, that some organic dielectrics are not optically transparent.

Figure 2E:
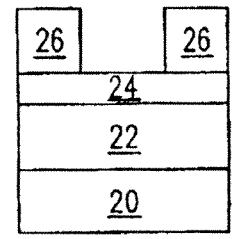

The exposed stack is developed to produce the stack of FIG. 2e. The absorbing and pH tuned spin-on ARC layer 24 is resistant to conventional photoresist developer solutions such as a 2.5% solution of tetramethylammoniumhydroxide (TMAH). In contrast, ARC layers, which have some of the chemical characteristics of the photoresist materials, are more sensitive to photoresist developers. Furthermore, it is anticipated that absorbing and pH tuned spin-on ARC layers are resistant to photoresist stripping processes, whereas organic ARC's are not resistant. Thus, use of absorbing and pH tuned spin-on layers may facilitate photoresist rework, without the need to reapply the ARC layer.

Figure 2F:
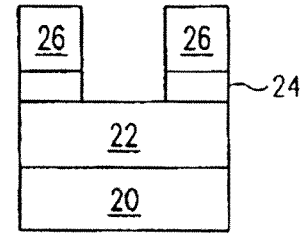

Next, a pattern is etched in the absorbing and tuned spin-on ARC layer 24 through the opening in photoresist layer 26 to produce the etched stack of FIG. 2f. A fluorocarbon etch, which has a high selectivity to photoresist, is used to etch the absorbing spin-on ARC layer 24. The response of the absorbing spin-on layer to a fluorocarbon etch provides an additional advantage of the absorbing and pH turned spin-on layer over organic ARC layers, which require an oxygen plasma etch. An oxygen plasma etch can degrade the critical dimension of the developed photoresist because the photoresist, being organic based, is also etched by an oxygen plasma. A fluorocarbon plasma consumes less photoresist than an oxygen plasma. At shorter UV wavelengths, depth of focus requirements will limit the thickness of photoresist layer 26 at the exposure step shown in FIG. 2d. For example, it is estimated that at 193 nm, the thickness of photoresist layer should be approximately 300 nm. Thus, as these short wavelengths start to be employed, it will be important to have an ARC layer that can be etched selectively with respect to the photoresist.

Figure 2G:
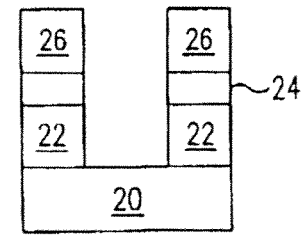
Figure 2H:
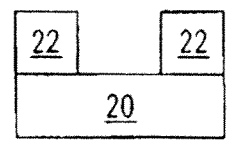

The fluorocarbon etch is continued through the dielectric layer 22 to produce the stack of FIG. 2g. Photoresist layer 26 is partially consumed during the continued etch process. Finally, the photoresist layer 26 is stripped using an oxygen plasma or a hydrogen reducing chemistry or via a wet chemistry and the spin-on ARC layer 24 is stripped using either a buffered oxide etch, for example a standard hydrofluoric acid/water mixture, non, partially or complete aqueous fluoride chemistry, or an aqueous or non-aqueous organoamine. Advantageously, the spin-on ARC layer can be stripped with solutions that show a good selectivity with respect to the underlying dielectric layer. Thus, the general photolithographic method shown in FIGS. 2a-2h illustrates the process advantages of absorbing spin-on materials as anti-reflective coating layers and as sacrificial anti-reflective coating layers.

EXAMPLES

The methods of synthesizing the absorbing spin-on materials comprising pH tuning agents in order to couple with and improve the compatibility of a resist material are illustrated in the following examples. The solutions and coatings prepared in the following examples are tuned in order to be compatible with several photoresist materials, including those that absorb around 157 nm, 193 nm, 248 nm, and 375 nm. An example of the 193 nm resist material is an acrylate resist material.

Example 1

Synthesis of an Absorbing Spin-on Material Containing 9-anthracene carboxy-methyl triethoxysilane and a pH Tuning Agent In a 22-liter flask 6331.20 grams 2-propanol, 3166.66 grams acetone, 2631.78 grams TEOS, 1639.78 grams MTEOS, 958.97 grams 9-anthracene carboxy-methyl triethoxysilane, 119.24 grams 0.1 M nitric acid and 1425.58 grams deionized water were combined. The flask was refluxed and/or heated for 1 to 12 hours. To the solution, 932.80 grams of butanol and 20650.0 g of ethyl lactate was added. The solution was filtered to be used in the pH tuning experiments. A pH tuning agent, 0.1 M nitric acid, was added to 2 separate solutions of 650 g of the spin-on material that has a starting pH of about 1.5. The nitric acid was added in the following amounts and gave the following pH: a) 2.794 g (pH=0.7); b) 0.293 g (pH=0.75). APTEOS was added to two additional and separate solutions of 650 g of the same spin-on material in the following amounts giving the following pH values: a) 0.053 g (pH=4.13); b) 0.151 g (pH=5.47). The solutions were then dispensed, followed by a 3000 rpm thickness spin for 20 seconds, and baked at 80° C. and at 180° C. for one minute each. Optical properties were measured with an N & K Technology Model 1200 analyzer. The film thickness was 1402.17 Å. At 248 nm, the refractive index (n) was 1.47 and the extinction coefficient (k) was 0.429. The same spin and bake process parameters and measurement technique was used in all of the following examples.

Synthesis of Another Absorbing Spin-on Material Containing 9-anthracene carboxy-methyl triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å. At 248 nm, the refractive index (n) was 1.373 and the extinction coefficient (k) was 0.268. It should be appreciated, however, that the refractive index and extinction coefficient data for this example and all of the following and contemplated examples could change depending on the purity of the initial reactants and starting compounds. The same spin and bake process parameters and measurement technique was used in all of the following examples.

Synthesis of Absorbing Spin-on Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.01 M nitric acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å. At 248 nm, the refractive index (n) was 1.373 and the extinction coefficient (k) was 0.268.

Synthesis of Absorbing Spin-on Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 1.0 M nitric acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å.

Synthesis of Absorbing Spin-on Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 100 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 , (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å.

Synthesis of Absorbing Spin-on Material Containing 9-anthracene carboxy-methyl Triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 130 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å.

Synthesis of Absorbing Spin-on Material Containing 9-anthracene carboxy-methyl triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 77 grams deionized water were combined. The flask was refluxed and/or heated for 1 to 12 hours. 1 g of APTEOS was added to the solution during refluxing. After refluxing, to the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å. At 248 nm, the refractive index (n) was 1.373 and the extinction coefficient (k) was 0.268.

Synthesis of Absorbing Spin-on Material Containing 9-anthracene carboxy-methyl triethoxysilane and pH Tuning Agent In a 1-liter flask 297 grams 2-propanol, 148 grams acetone, 123 grams TEOS, 77 grams MTEOS, 60 grams 9-anthracene carboxy-methyl triethoxysilane, 0.6 grams 0.1 M nitric acid and 77 grams deionized water were combined. The flask was refluxed and/or heated for 1 to 12 hours. 1 g of APTEOS was added to the solution after refluxing. Also after refluxing, to the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. The film thickness was 1635 Å.

Synthesis of Absorbing Spin-on Material Containing 9-anthracene carboxy-ethyl triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams 1.0 M acetic acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-ethyl triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams 1.0 M acetic acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-ethyl triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams pure acetic acid and 72 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-ethyl triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams 10 M acetic acid and 100 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-ethyl triethoxysilane and a pH Tuning Agent In a 1-liter flask 297 grams 2-propanol, 148 grams acetone, 123 grams TEOS, 77 gams MTEOS, 60 grams 9-anthracene carboxy-ethyl triethoxysilane, 0.6 grams 1.0 M acetic acid and 130 grams deionized water were combined. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-ethyl triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams pure acetic acid and 72 grams deionized water were combined. 1.0 g of potassium hydroxide was added before refluxing. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-ethyl triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams 10 M acetic acid and 72 grams deionized water were combined. 1.0 g of potassium hydroxide was added during refluxing. The flask was refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-ethyl triethoxysilane and a pH Tuning Agent In a 1-liter flask 297 grams 2-propanol, 148 grams acetone, 123 grams TEOS, 77 grams MTEOS, 60 grams 9-anthracene carboxy-ethyl triethoxysilane, 0.6 grams 1.0 M acetic acid and 72 grams deionized water were combined. The flask was refluxed and/or heated for 1 to 12 hours. 1.0 g of potassium hydroxide was added before refluxing. Also, to the solution, 115 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-propyl triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams pure lactic acid and 40 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. Thickness is 1487.1 Angstroms; k=0.4315; n=1.4986.

Synthesis of Absorbing Spin-on Material Containing 9-anthracene carboxy-propyl triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 40 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-propyl triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams pure lactic acid and 40 grams deionized water were combined. The flask was refluxed and/or heated for 1 to 12 hours. To the solution, 26 grams of butanol. 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-propyl triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 1.0 M lactic acid and 70 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-propyl triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 90 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-propyl triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 40 grams deionized water were combined. 1.5 g of TMAH was added to the solution before refluxing. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-propyl triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 40 grams deionized water were combined. 1.5 g of TMAH was added to the solution during refluxing. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-propyl triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 40 grams deionized water were combined. The flask was refluxed and/or heated for 1 to 12 hours. 1.5 g of TMAH was added to the solution after refluxing. Also after refluxing, to the solution, 26 grams of butanol, 488 grams 2-propanol, 245 grams of acetone, 329 grams of ethanol, 53 grams deionized water and 3.8 grains of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer.

Synthesis of Absorbing Spin-on Material Containing 9-anthracene carboxy-propyl triethoxysilane and a pH Tuning Agent In a 1-liter flask 178 grams 2-propanol, 89 grams acetone, 52 grams TEOS, 59 grams MTEOS, 29 grams 9-anthracene carboxy-propyl triethoxysilane, 3.3 grams 10 M lactic acid and 40 grams deionized water were combined. The flask was refluxed and/or heated for 1 to 12 hours. To the solution, 26 grams of butanol, 488 grams 2-propanol, 245 grams of acetone, 329 grams of ethanol, 53 grams deionized water and 3.8 grams of 10% FC 430 (3M, Minneapolis, Minn.) were added. The solution was filtered. The solution was dispensed, followed by a 3000 rpm thickness spin for 20 seconds, and baked at 80° C. and at 180° C. for one minute each. Optical properties were measured with an N & K Technology Model 1200 analyzer. Thickness is 1487.1 Angstroms; k=0.4315; n=1.4986.

Example 2

Synthesis of Absorbing Spin-on Material Containing 9-anthracene methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenylketone, 5 grams rosolic acid, 0.6 grams 0.1 M nitric acid and 72 grams deionized water were combined. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added. Thickness=1436 Å, n=1.479, k=0.1255.

Synthesis of Absorbing Spin-on Material Containing 9-anthracene methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenylketone, 5 grams rosolic acid, 0.6 grams 0.01 M nitric acid and 72 grams deionized water were combined. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilypropoxy)-diphenylketone, 5 grams rosolic acid, 0.6 grams 1.0 M nitric acid and 72 grams deionized water were combined. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilylpropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilylpropoxy)-diphenylketone, 5 grams rosolic acid, 0.6 grams 0.1 M nitric acid and 95 grams deionized water were combined. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilylpropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilylpropoxy)-diphenylketone, 5 grams rosolic acid, 0.6 grams 0.1 M nitric acid and 110 grams deionized water were combined. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilylpropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilylpropoxy)-diphenylketone, 5 grams rosolic acid, 0.6 grams 0.1 M nitric acid and 72 grams deionized water were combined. 1.2 g of APTEOS was added to the solution before refluxing. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilylpropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilylpropoxy)-diphenylketone, 5 grams rosolic acid, 0.6 grams 0.1 M nitric acid and 72 grams deionized water were combined. 1.2 g of APTEOS was added to the solution during refluxing. The flask was refluxed and/or heated for 1 to 12 hours. To the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilylpropoxy)-diphenylketone, Rosolic Acid, and a pH Tuning Agent In a 1-liter flask 297 grams 2-propanol, 148 grams acetone, 123 grams TEOS, 77 grams MTEOS, 25 grams 9-anthracene methanol, 10 grams 2-hydroxy-4-(3-triethoxysilylpropoxy)-diphenylketone, 5 grams rosolic acid, 0.6 grams 0.1 M nitric acid and 72 grams deionized water were combined. The flask was refluxed and/or heated for 1 to 12 hours. 1.2 g of APTEOS was added to the solution after refluxing. Also, after refluxing, to the solution, 111 grams of butanol, 459 grams 2-propanol, 230 grams of acetone, 309 grams of ethanol, 50 grams deionized water and 3.75 grams of 10% FC 430 (3M, Minneapolis, Minn.) were added.

Example 3

Synthesis of Absorbing SOG Containing 9-anthracene methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilylpropoxy)-diphenylketone, 5 grams rosolic acid, 0.5599 grams 10 M acetic acid and 71.90 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 7 grams MTEOS, 20 grams 9-anthracene methanol, 60 grams 2-hydroxy-4-(3-triethoxysilylpropoxy)-diphenylketone, 5 grams rosolic acid, 0.5599 grams 1.0 M acetic acid and 71.90 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams pure acetic acid and 71.90 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene methanol, 2-hydroxy-4-(3-triethoxysilypropoxy)-diphenylketone, Rosolic Acid, and a pH Tuning Agent In a flask 297 grams 2-propanol, 48 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 10 M acetic acid and 95 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 10 M acetic acid and 120 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 10 M acetic acid and 71.90 grams deionized water were combined. 2.2 g of potassium hydroxide was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 10 M acetic acid and 71.90 grams deionized water were combined. 2.2 g of potassium hydroxide was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing SOG Containing 9-anthracene methanol, 2-hydroxy-4-(3-triethoxysilypropoxy)-diphenylketone, Rosolic Acid, and a pH Tuning Agent In a 1-liter flask 297 grams 2-propanol, 148 grams acetone, 93 grams TEOS, 77 grams MTEOS, 20 grams 9-anthracene methanol, 60 grams 2-hydroxy-4-(3-triethoxysilypropoxy)-diphenylketone, 5 grams rosolic acid, 0.5599 grams 1075 M acetic acid and 71.90 grams deionized water were combined. The flask was refluxed and/or heated for 1 to 12 hours. 2.2 g of potassium hydroxide was added to the solution after refluxing. Also, after refluxing, to the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Example 4

Synthesis of Absorbing SOG Containing 9-anthracene methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.01 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 1.0 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 95 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k =0.124.

Synthesis of Absorbing SOG Containing 9-anthracene methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 125 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 72 grams deionized water were combined. 3 g of APTEOS was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene methanol, 2-hydroxy-4-(3-triethoxysilypropoxy)-diphenylketone, Rosolic Acid, and pH Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypropoxy)-diphenylketone, 5 grams rosolic acid, 0.5599 grams 0.1 M nitric acid and 72 grams deionized water were combined. 3 g of APTEOS was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Synthesis of Absorbing SOG Containing 9-anthracene methanol, 2-hydroxy-4-(3-triethoxysilypropoxy)-diphenylketone, Rosolic Acid, and Tuning Agent In a 1-liter flask 297 grams 2-propanol, 148 grams acetone, 108 grams TEOS, 77 grams MTEOS, 10 grams 9-anthracene methanol, 60 grams 2-hydroxy-4-(3-triethoxysilypopoxy)-diphenylketone, 5 grams rosolic acid, 0.5599 grams 0.1 M nitric acid and 72 grams deionized water were combined. The flask was refluxed and/or heated for 1 to 12 hours. 3 g of APTEOS was added to the solution after refluxing. Also, after refluxing, to the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=4275 Å, n=1.529, k=0.124.

Example 5

Synthesis of Absorbing Spin-on Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3592 Å, n=1.563, k=0.067.

Synthesis of Absorbing Spin-on Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.01 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 1.0 M nitric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 90 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 125 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 72 grams deionized water were combined. 0.26 g of APTEOS was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 72 grams deionized water were combined. 0.26 g of APTEOS was added to the solution during the refluxing step. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-triethoxysilypropoxy)-diphenylketone, 0.6 grams 0.1 M nitric acid and 72 grams deionized water were combined. The flask was refluxed and/or heated for 1 to 12 hours. 0.26 g of APTEOS was added to the solution after refluxing. Also, after refluxing, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added to the solution.

Synthesis of Absorbing Spin-on Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 10 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 1.0 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 1.0 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 75 grams 2-hydroxy- 4-(3-trimethoxysilypropoxy)-diphenylketone, 0.6 grams 10 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M. Minneapolis, Minn.) were added.

Synthesis of Absorbing Spin-on Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 10 M lactic acid and 115 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 10 M lactic acid and 72 grams deionized water were combined. 0.06 g of APTEOS was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-triethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 10 M lactic acid and 72 grams deionized water were combined. 0.06 g of APTEOS was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 2-hydroxy-4-(3-trimethoxysilypropoxy)-diphenylketone and a pH Tuning Agent In a 1-liter flask 297 grams 2-propanol, 148 grams acetone, 123 grams TEOS, 51 grams MTEOS, 60 grams 2-hydroxy-4-(3-trimethoxysilypropoxy)-diphenylketone, 0.6 grams 10 M lactic acid and 72 grams deionized water were combined. The flask was refluxed and/or heated for 1 to 12 hours. 0.06 g of APTEOS was added to the solution after refluxing. After refluxing, 57 grams of butanol, 88 grams 2-propanol, 44 grams of acetone, 59 grams of ethanol, 9.5 grams deionized water and 3.75 grams of 10% FC 430 (3M, Minneapolis, Minn.) were also added to the solution.

Example 6

Synthesis of Absorbing Spin-on Material Containing 9-anthracene methanol and a pH Tuning Agent In a 1-liter flask 297 grams 2-propanol, 148 grams acetone, 3 grams TEOS, 77 grams MTEOS, 10 grams 9-anthracene methanol, 0.6 grams 0.1 M hydrochloric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.01 M hydrochloric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol and a pH Tuning Agent In a 1-liter flask 297 grams 2-propanol, 148 grams acetone, 123 grams TEOS, 77 grams MTEOS, 10 grams 9-anthracene methanol, 0.6 grams 1.0 M hydrochloric acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 100 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 130 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 72 grams deionized water were combined. 1.2 g of potassium hydroxide was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 72 grams deionized water were combined. 1.2 g of potassium hydroxide was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol and a pH Tuning Agent In a 1-liter flask 297 grams 2-propanol, 148 grams acetone, 123 grams TEOS, 77 grams MTEOS, 10 grams 9-anthracene methanol, 0.6 grams 0.1 M hydrochloric acid and 72 grams deionized water were combined. The flask was refluxed and/or heated for 1 to 12 hours. 1.2 g of potassium hydroxide was added to the solution after refluxing. Also after refluxing, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added to the solution.

Example 7

Synthesis of Absorbing Spin-on Material Containing 9-anthracene methanol, 2-hydroxy-4-(3-triethoxysilpropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 1.0 M acetic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3503 Å, n=1.475, k=0.193.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone. 25 grams of 9-anthracene methanol, and 5 grams of rosolic acid, 0.6 grams 10 M acetic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams pure M acetic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 10 M acetic acid and 98 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 10 M acetic acid and 120 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 10 M acetic acid and 72 grams deionized water were combined. 1.5 g of TMAH was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 10 M acetic acid and 72 grams deionized water were combined. 1.5 g of TMAH was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 0.6 grams 10 M acetic acid and 72 grams deionized water were combined. The flask was refluxed and/or heated for 1 to 12 hours. 1.5 g of TMAH was added to the solution after refluxing. Also after refluxing, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added to the solution.

Example 8

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added. Thickness=3119 Å, n=1.454, k=0.175.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 1.0 M lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone. 123 grams TEOS, 77 grams MTEOS, 5 grams 2-hydroxy-4-(3-triethylsilyl-propoxy)-diphenylketone, 25 grams of 9-anthracene methanol, and 5 grams of rosolic acid, 0.6 grams pure lactic acid and 72 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 100 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 130 grams deionized water were combined. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 72 grams deionized water were combined. 0.1 g of APTEOS was added to the solution before refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 72 grams deionized water were combined. 0.1 g of APTEOS was added to the solution during refluxing. The flask was refluxed and/or heated for 1 to 12 hours. To the solution, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added.

Synthesis of Absorbing Spin-on Material Containing 9-anthracene methanol, 2-hydroxy-4-(3-triethoxysilypropoxy)-diphenylketone, Rosolic Acid and a pH Tuning Agent In a 1-liter flask 297 grams 2-propanol, 148 grams acetone, 123 grams TEOS, 77 grams MTEOS, 5 grams 2-hydroxy-4-(3-triethoxysilypropoxy)-diphenylketone, 25 grams of 9-anthracene methanol, and 5 grams of rosolic acid, 0.6 grams 10 M lactic acid and 72 grams deionized water were combined. The flask was refluxed and/or heated for 1 to 12 hours. 0.1 g of APTEOS was added to the solution after refluxing. Also after refluxing, 57 grams of butanol, 88 grams 2-propanol, 44 grams of acetone, 59 grams of ethanol, 9.5 grams deionized water and 3.75 grams of 10% FC 430 (3M, Minneapolis, Minn.) were added to the solution.

Example 9

Synthesis of Absorbing Spin-on Material Containing 9-anthracene methanol, 2-hydroxy-4-(3-triethoxysilypropoxy)-diphenylketone, Rosolic Acid, quinizarin, alizarin and a pH Tuning Agent In a 1-liter flask 297 grams 2-propanol, 148 grams acetone, 123 grams TEOS, 77 grams MTEOS, 20 grams 2-hydroxy-4-(3-triethoxysilypropoxy)-diphenylketone, 25 grams of 9-anthracene methanol, and 5 grams of rosolic acid, 2 grams of quinizarin, 2 grams alizarin, 0.6 grams 0.1 M nitric acid, 1.0 M nitric acid and 0.01 M nitric acid (added to three separate mixtures) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added. Thickness=3554 Å, n=1.489, k=0.193.

In three additional solutions, 1.1 g of potassium hydroxide was added. In each solution, the potassium hydroxide was added before, during and after the refluxing step, respectively.

Example 10

Synthesis of Absorbing Spin-on Material Containing 9-anthracene methanol, 2-hydroxy-4-(3-triethoxysilypropoxy)-diphenylketone, Rosolic Acid, alizarin and a pH Tuning Agent In a 1-liter flask 297 grams 2-propanol, 148 grams acetone, 123 grams TEOS, 51.5 grams MTEOS, 5 grams 2-hydroxy-4-(3-triethoxysilypropoxy)-diphenylketone, 25 grams of 9-anthracene methanol, 5 grams of rosolic acid, and 2 grams alizarin, 0.5599 grams 1.0 M, 10 M and pure acetic acid (added to three separate mixtures, respectively) and 71.90 grams deionized water were combined. In two other solutions containing 10 M acetic acid, 90 g and 110 g of deionized water were added, respectively. The flask was refluxed and/or heated for 1 to 12 hours. To the solution, 56.68 grams of butanol, 87.99 grams 2-propanol, 44.10 grams of acetone, 59.31 grams of ethanol, 9.55 grams deionized water and 3.75 grams of 10% FC 430 (3M, Minneapolis, Minn.) were added.

In three additional solutions, 0.25 g of APTEOS was added. In each solution, the APTEOS was added before, during and after the refluxing step, respectively.

Example 11

Synthesis of Absorbing Spin-on Material Containing 9-anthracene carboxy-methyl triethoxysilane and a pH Tuning Agent In a 1-liter flask 297 grams 2-propanol, 148 grams acetone, 123 grams TEOS, 77 grams MTEOS, 30 grams 9-anthracene carboxy-methyl triethoxysilane, 0.6 grams 0.1 M, 0.01 Ma and 1.0 M nitric acid (added to three separate solutions, respectively) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 0.25 g of HCl was added. In each solution, the HCl was added before, during and after the refluxing step, respectively.

Synthesis of Absorbing Spin-on Material Containing 9-anthracene carboxy-ethyl triethoxysilane and a pH Tuning Agent In a 1-liter flask 297 grams 2-propanol, 148 grams acetone, 123 grams TEOS, 77 grams MTEOS, 30 grams 9-anthracene carboxy-ethyl triethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.2 g of APTEOS was added. In each solution, the APTEOS was added before, during and after the refluxing step, respectively.

Synthesis of Absorbing Spin-on Material Containing 9-anthracene carboxy-propyl triethoxysilane and a pH Tuning Agent In a 1-liter flask 297 grams 2-propanol, 148 grams acetone, 123 grams TEOS, 77 grams MTEOS, 30 grams 9-anthracene carboxy-propyl triethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 0.2 g of APTEOS was added. In each solution, the APTEOS was added before, during and after the refluxing step, respectively.

Synthesis of Absorbing Spin-on Material Containing 9-anthracene carboxy-pentyl triethoxysilane and a pH Tuning Agent In a 1-liter flask 297 grams 2-propanol, 148 grams acetone, 123 grams TEOS, 77 grams MTEOS, 30 grams 9-anthracene carboxy-pentyl triethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 2.4 g of potassium hydroxide was added. In each solution, the potassium hydroxide was added before, during and after the refluxing step, respectively.

Synthesis of Absorbing Spin-on Material Containing 9-anthracene carboxy-methyl trimethoxysilane and a pH Tuning Agent In a 1-liter flask 297 grams 2-propanol, 148 grams acetone, 123 grams TEOS, 77 grams MTEOS, 30 grams 9-anthracene carboxy-methyl trimethoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 2.4 g of TMAH was added. In each solution, the TMAH was added before, during and after the refluxing step, respectively.

Synthesis of Absorbing Spin-on Material Containing 9-anthracene carboxy-ethyl trimethoxysilane and a pH Tuning Agent In a 1-liter flask 297 grams 2-propanol, 148 grams acetone, 123 grams TEOS, 77 grams MTEOS, 30 grams 9-anthracene carboxy-ethyl trimethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.2 g of APTEOS was added. In each solution, the APTEOS was added before, during and after the refluxing step, respectively.

Synthesis of Absorbing Spin-on Material Containing 9-anthracene carboxy-propyl trimethoxysilane and a pH Tuning Agent In a 1-liter flask 297 grams 2-propanol, 148 grams acetone, 123 grams TEOS, 77 grams MTEOS, 30 grams 9-anthracene carboxy-propyl trimethoxysilane, 0.6 grams 0.1 M, 0.01 M and 1.0 M hydrochloric acid (added to three separate solutions, respectively) and 72 grams deionized water were combined. In two other solutions containing 0.1 M hydrochloric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.4 g of APTEOS was added. In each solution, the APTEOS was added before, during and after the refluxing step, respectively.

Example 12

Synthesis of Absorbing Spin-on Material Containing 9-anthracene methanol and a pH Tuning Agent In a 1-liter flask 297 grams 2-propanol, 148 grams acetone, 123 grams TEOS, 77 grams MTEOS, and 10 grams 9-anthracene methanol are combined. The solution is refluxed for 6 hours. A mixture of 0.6 grams 0.1 M. 0.01 M and 1.0 M hydrochloric acid (added to three separate solutions, respectively) and 72 grams deionized water were combined. In two other solutions containing 0.1 M hydrochloric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.4 g of APTEOS was added. In each solution, the APTEOS was added before, during and after the refluxing step, respectively.

Synthesis of Absorbing Spin-on Material Containing 9-anthracene ethanol and a pH Tuning Agent In a 1-liter flask 297 grams 2-propanol, 148 grams acetone, 123 grams TEOS, 77 grams MTEOS, and 10 grams 9-anthracene ethanol are combined. The solution is refluxed for 6 hours. A mixture of 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 0.4 g of APTEOS was added. In each solution, the APTEOS was added before, during and after the refluxing step, respectively.

Synthesis of Absorbing Spin-on Material Containing 9-anthracene propanol and a pH Tuning Agent In a 1-liter flask 297 grams 2-propanol, 148 grams acetone, 123 grams TEOS, 77 grams MTEOS, and 10 grams 9-anthracene propanol are combined. The solution is refluxed for 6 hours. A mixture of 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask was refluxed and/or heated for 1 to 12 hours. To the solution, 57 grams of butanol, 88 grams 2-propanol, 44 grams of acetone, 59 grams of ethanol, 9.5 grams deionized water and 3.7 grams of 10% FC 430 (3M, Minneapolis, Minn.) were added.

In three additional solutions, 1.25 g of TMAH was added. In each solution, the TMAH was added before, during and after the refluxing step, respectively.

Example 13

Synthesis of Absorbing Spin-on Material Containing 9-anthracene carboxy-methyl triethoxysilane and a pH Tuning Agent In a 1-liter flask 297 grams 2-propanol, 148 grams acetone, 90 grams TMOS, 59 grams MTMOS, 60 grams 9-anthracene carboxy-methyl triethoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions. 1.25 g of TMAH was added. In each solution, the TMAH was added before, during and after the refluxing step, respectively.

Synthesis of Absorbing Spin-on Material Containing 9-anthracene carboxy-ethyl triethoxysilane and a pH Tuning Agent In a 1-liter flask 297 grams 2-propanol, 148 grams acetone, 90 grams TMOS, 59 grams MTMOS, 60 grams 9-anthracene carboxy-ethyl triethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 0.25 g of TMAH was added. In each solution, the TMAH was added before, during and after the refluxing step, respectively.

Synthesis of Absorbing Spin-on Material Containing 9-anthracene carboxy-methyl trimethoxysilane and a pH Tuning Agent In a 1-liter flask 297 grams 2-propanol, 148 grams acetone, 90 grams TMOS, 59 grams MTMOS, 60 grams 9-anthracene carboxy-methyl trimethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 1.5 g of potassium hydroxide was added. In each solution, the potassium hydroxide was added before, during and after the refluxing step, respectively.

Synthesis of Absorbing Spin-on Material Containing 9-anthracene carboxy-propyl triethoxysilane and a pH Tuning Agent In a 1-liter flask 297 grams 2-propanol, 148 grams acetone, 90 grams TMOS, 59 grams MTMOS, 60 grams 9-anthracene carboxy-propyl triethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 0.5 g of TMAH was added. In each solution, the TMAH was added before, during and after the refluxing step, respectively.

Synthesis of Absorbing Spin-on Material Containing 9-anthracene carboxy-methyl tripropoxysilane and a pH Tuning Agent In a 1-liter flask 297 grams 2-propanol, 148 grams acetone, 90 grams TMOS, 59 grams MTMOS, 60 grams 9-anthracene carboxy-methyl tripropoxysilane, 0.6 grams 1.0 M. 10 M and pure acetic acid (added to three separate solutions, respectively) and 72 grams deionized water were combined. In two other solutions containing 10 M acetic acid, 90 g and 110 g of deionized water were added, respectively. The flask is refluxed and/or heated for 1 to 12 hours* To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 0.75 g of TMAH was added. In each solution, the TMAH was added before, during and after the refluxing step, respectively.

Synthesis of Absorbing Spin-on Material Containing 9-anthracene carboxy-ethyl tributoxysilane and a pH Tuning Agent In a 1-liter flask 297 grams 2-propanol, 148 grams acetone, 90 grams TMOS, 59grams MTMOS, 60 grams 9-anthracene carboxy-ethyl tributoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask is refluxed and/or heated for 1 to 12 hours. To the solution, 115 grams of butanol, 488 grams 2-propanol, 245 grams of acetone, 329 grams of ethanol, 53 grams deionized water and 3.8 grams of 10% FC 430 (3M, Minneapolis, Minn.) are added.

In three additional solutions, 1.00 g of TMAH was added. In each solution, the TMAH was added before, during and after the refluxing step, respectively.

Example 14

Synthesis of Absorbing Spin-on Material Containing phenyltriethoxysilane and a pH Tuning Agent In a 1-liter flask 297 grams (4.798 mols) 2-propanol, 148 grams (2.558 moles) acetone, 123 grams (0.593 moles) TEOS, 104 grams (0.432 moles) phenyltriethoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask was refluxed and/or heated for 1 to 12 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added. Thickness=1727 Å, n=1.957, k=0.384.

In three additional solutions, 1.00 g of TMAH was added. In each solution, the TMAH was added before, during and after the refluxing step, respectively.

Synthesis of Absorbing Spin-on Material Containing phenyltrimethoxysilane and a pH Tuning Agent In a 1-liter flask 297 grams (4.798 moles) 2-propanol, 148 grams (2.558 moles) acetone, 123 grams (0.593 moles) TEOS, 104 grams (0.432 moles) phenyltriethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 1.00 g of APTEOS was added. In each solution, the APTEOS was added before, during and after the refluxing step, respectively.

Synthesis of Absorbing Spin-on Material Containing phenyltripropoxysilane and a pH Tuning Agent In a 1-liter flask 297 grams (4.798 moles) 2-propanol, 148 grams (2.558 moles) acetone, 123 grams (0.593 moles) TEOS, 104 grams (0.432 moles) phenyltriethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask was refluxed and/or heated for 1 to 12 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 0.75 g of APTEOS was added. In each solution, the APTEOS was added before, during and after the refluxing step, respectively.

Synthesis of Absorbing Spin-on Material Containing phenyltributoxysilane and a pH Tuning Agent In a 1-liter flask 297 grams (4.798 moles) 2-propanol, 148 grams (2.558 moles) acetone, 123 grams (0.593 moles) TEOS, 104 grams (0.432 moles) phenyltriethoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask was refluxed and/or heated for 1 to 12 hours. To the solution, 57 grams (0.769 moles) of Butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 0.50 g of APTEOS was added. In each solution, the APTEOS was added before, during and after the refluxing step, respectively.

Example 15

Synthesis of Absorbing Spin-on Material Containing 4-ethoxyphenylazobenzene-4-carboxy-methyl triethoxysilane and a pH Tuning Agent In a 1-liter flask 297 grams (4.798 moles) 2-propanol, 148 grams (2.558 moles) acetone, 123 grams (0.593 moles) TEOS, 77 grams (0.432 moles) MTEOS, 44.5 grams (0.13 moles) 4-ethoxyphenylazobenzene-4-carboxy-methyl triethoxysilane, 0.6 grams 1.0 M, 10 M and pure acetic acid (added to three separate solutions, respectively) and 72 grams deionized water were combined. In two other solutions containing 10 M acetic acid, 90 g and 110 g of deionized water were added, respectively. The flask was refluxed and/or heated for 1 to 12 hours. To the solution, 57 grams (0.769 moles) of butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 0.50 g of APTEOS was added. In each solution, the APTEOS was added before, during and after the refluxing step, respectively.

Synthesis of Absorbing Spin-on Material Containing 4-ethoxyphenylazobenzene-4-carboxy-ethyl triethoxysilane In a 1-liter flask 297 grams (4.798 moles) 2-propanol, 148 grams (2.558 moles) acetone, 123 grams (0.593 moles) TEOS, 77 grams (0.432 moles) MTEOS, 44.5 grams (0.13 moles) 4-ethoxyphenylazobenzene-4-carboxy-methyl triethoxysilane, 0.6 grams 1.0 M, 10 M and pure lactic acid (added to three separate solutions, respectively) and 72 grams deionized water were combined. In two other solutions containing 10 M lactic acid, 90 g and 110 g of deionized water were added, respectively. The flask was refluxed and/or heated for 1 to 12 hours. To the solution, 57 grams (0.769 moles) of butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 0.25 g of APTEOS was added. In each solution, the APTEOS was added before, during and after the refluxing step, respectively.

Synthesis of Absorbing Spin-on Material Containing 4-methoxyphenylazobenzene-4-carboxy-propyl triethoxysilane In a 1-liter flask 297 grams (4.798 moles) 2-propanol, 148 grams (2.558 moles) acetone, 123 grams (0.593 moles) TEOS, 77 grams (0.432 moles) MTEOS, 44.5 grams (0.13 moles) 4-ethoxyphenylazobenzene-4-carboxy-methyl triethoxysilane, 0.6 grams 0.1 M, 0.01 M and 1.0 M nitric acid (added to three separate solutions, respectively) and 72 grams deionized water were combined. In two other solutions containing 0.1 M nitric acid, 90 g and 110 g of deionized water were added, respectively. The flask was refluxed and/or heated for 1 to 12 hours. To the solution, 57 grams (0.769 moles) of butanol, 88 grams (1.422 moles) 2-propanol, 44 grams (0.758 moles) of acetone, 59 grams (1.227 moles) of ethanol, 9.5 grams (0.528 moles) deionized water were added.

In three additional solutions, 0.10 g of APTEOS was added. In each solution, the APTEOS was added before, during and after the refluxing step, respectively.

Synthesis of Absorbing Spin-on Material Containing 4-methoxyphenylazobenzene-4-carboxy-propyl trimethoxysilane In a 1-liter flask 297 grams (4.798 moles) 2-propanol, 148 grams (2.558 moles) acetone, 123 grams (0.593 moles) TEOS, 77 grams (0.432 moles) MTEOS, 44.5 grams (0.13 moles) 4-ethoxyphenylazobenzene-4-carboxy-methyl triethoxysilane, 0.6 grams 0.1 M, 0.01 M and 1.0 M hydrochloric acid (added to three separate solutions, respectively) and 72 grams deionized water were combined. In two other solutions containing 0.1 M hydrochloric acid, 90 g and 110 g of deionized water were added, respectively. The flask was refluxed and/or heated for 1 to 12 hours. To the solution, 57 grams (0.769 moles) of butanol, 88 grams (1.422 moles) 2-propanol, 44 grams (0.758 moles) of acetone, 59 grams (1.227 moles) of ethanol, 9.5 grams (0.528 moles) deionized water were added. n=1.499, k=0.162 at 365 nm.

In three additional solutions, 0.50 g of TMAH was added. In each solution, the TMAH was added before, during and after the refluxing step, respectively.

Example 16

Synthesis of an Absorbing Spin-on Material Containing PGMEA and a pH Tuning Agent In a 1-liter flask, 504.829 g of PGMEA, 123.6 grams TEOS, 76.9 grams MTEOS, 5.608 grams 0.1 M nitric acid and 66.869 grams deionized water were combined. The flask was refluxed and/or heated for 1 to 12 hours. To the solution, 43.777 grams of butanol was added. The solution was filtered to be used in the pH tuning experiments.

In another 1-liter flask, 297 grams 2-propanol, 148.560 grams acetone, 139.902 grams TEOS, 19.10 grams MTEOS, 51.7 g PTEOS, 5.624 grams 0.1 M nitric acid and 66.827 grams deionized water were combined. The flask was refluxed and/or heated for 1 to 12 hours. To the solution, 43.93 grams of butanol was added. The solution was filtered to be used in the pH tuning experiments.

The two solutions prepared were combined, and a pH tuning agent, APTEOS, was added to 6 separate solutions of 650 g of the combined spin-on material that has a starting pH of about 1.7. The APTEOS was added in the following amounts and gave the following pH: a) 1.49 g (pH=8.07); b) 0.26 g (pH=7.12); c) 0.1 g (pH=6.29); d) 0.06 (pH=5.50); e) 0.03 g (pH=2.49); f) 0 grams (pH=1.76). The solutions were then dispensed, followed by a 3000 rpm thickness spin for 20 seconds, and baked at 80° C. and at 180° C. for one minute each. Optical properties were measured with an N & K Technology Model 1200 analyzer. Optical properties follow for each of the A-F solutions shown above:

a) Thickness=1686 Angstroms; k=0.297; n=1.802; etch ratio(er)=9.33
b) Thickness=1332 Angstroms; k=0.295; n=1.802; etch ratio(er)=8.5
c) Thickness=1298 Angstroms; k=0.294; n=1.802; etch ratio(er)=8.316
d) Thickness=1292 Angstroms; k=0.293; n=1.802; etch ratio(er)=8.17
e) Thickness=1304.9 Angstroms; k=0.292; n=1.802; etch ratio(er)=8.01
f) Thickness=1263.9 Angstroms; k=0.289; n=1.802; etch ratio(er)=7.83

Thus, specific embodiments and applications of compositions and methods to produce spin-on materials, spin-on inorganic materials and spin-on glass materials comprising absorbing compounds and that comprise a pH tuning agent have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. An absorbing spin-on-glass composition comprising:
   at least one inorganic-based compound,
   at least one organic absorbing compound chemically bonded to the at least one inorganic-based compound, and
   at least one pH tuning agent comprising a base.

2. The composition of claim 1, wherein the absorbing compound absorbs light over at least an approximately 5 nm wide wavelength range at wavelengths less than 375 nm.

3. The composition of claim 1, wherein the absorbing compound absorbs light over at least an approximately 10 nm wide wavelength range at wavelengths less than 375 nm.

4. The composition of claim 2, wherein the range is at wavelengths less than about 260 nm.

5. The composition of claim 1, wherein the absorbing compound comprises at least one benzene ring and a reactive group formed from one of a hydroxyl group, an amine group, a carboxylic acid group, and a substituted silyl group.

6. The composition of claim 5, wherein the absorbing compound comprises two or more benzene rings.

7. The composition of claim 6, wherein the two or more benzene rings are fused.

8. The composition of claim 1, wherein the at least one organic absorbing compound is formed from or comprises anthraflavic acid, 9-anthracene carboxylic acid, 9-anthracene methanol, alizarin, quinizarin, primuline, 2-hydroxy-4(3-triethoxysilylpropoxy)-diphenylketone, rosolic acid, triethoxysilylpropyl-1,8-naphthalimide, 9-anthracene carboxy-alkyl triethoxysilane, phenyltriethoxysilane, 10-phenanthrene carboxy-methyl triethoxysilane, 4-phenylazophenol, 4-ethoxyphenylazobenzene -4-carboxy-methyl triethoxysilane, 4-methoxyphenylazobenzene-4-carboxy-methyl triethoxysilane, or mixtures thereof.

9. The composition of claim 1, wherein the inorganic-based compound comprises a silicon-based compound.

10. The composition of claim 9, wherein the silicon-based compound comprises a polymer.

11. The composition of claim 10, wherein the polymer comprises methylsiloxane, methylsilsesquioxane, phenylsiloxane, phenylsilsesquioxane, methylphenylsiloxane, methylphenylsilsesquioxane, silicate polymers, silazane polymers or mixtures thereof.

12. The composition of claim 10, wherein the polymer comprises hydrogensiloxane, hydrogensilsesquioxane, organohydridosiloxane, organhydridosilsesquioxane, copolymers of hydrogensilsesquioxane and an alkoxyhydridosiloxane or hydroxyhydridosiloxane, or mixtures thereof.

13. The composition of claim 11, wherein the polymer comprises methylphenylsiloxane.

14. The composition of claim 1, wherein the base comprises an amine.

15. The composition of claim 14, wherein the amine comprises an amine-based oligomer.

16. The composition of claim 1, wherein the spin-on composition is designed to be at least partially removed.

17. The composition of claim 1, wherein the pH tuning agent comprises γ-aminopropyltriethoxysilane (APTEOS).

18. The composition of claim 1, wherein the composition has a refractive index between about 1.3 and about 2.0 and an extinction coefficient greater than approximately 0.07.

19. The composition of claim 1, wherein the at least one inorganic-based compound is synthesized from silane reactants in the presence of an acid/water mixture.

20. The composition of claim 19, wherein the silane reactants comprise tetraethoxysilane (TEOS) and methyltriethoxysilane (MTEOS).

21. The composition of claim 1, wherein the composition is formed from a reaction mixture consisting of:
the at least one inorganic-based compound,
the at least one absorbing compound,
the at least one pH tuning agent,
an acid/water mixture, and
at least one solvent.

22. The composition of claim 1, wherein the at least one absorbing compound comprises phenyltriethoxysilane (PTEOS).

23. The composition of claim 1, wherein the at least one absorbing compound comprises a naphthalene group, an anthracene group, a phenanthrene group, or a phenyl group.

24. An absorbing spin-on-glass composition comprising:
at least one inorganic-based compound comprising a polymer,
at least one organic absorbing compound incorporated into the polymer, and
at least one pH tuning agent comprising a base,
wherein the polymer is of a general formula comprising $(H_{0-1.0}SiO_{1.5-2.0})_x$, where x is greater than about 4, or $(H_{0-1.0}SiO_{1.5-2.0})_n(R_{0-1.0}SiO_{1.5-2.0})_m$, where m is greater than 0, the sum of n and m is from about 4 to about 5000 and R is a $C_1$-$C_{20}$ alkyl group or a $C_6$-$C_6$-$C_{12}$ aryl group.

25. A coating solution comprising the spin-on composition of claim 1 and a solvent or a solvent mixture.

26. The coating solution of claim 25, wherein the solution is between about 0.5% and about 20% by weight spin-on composition.

27. A layered material comprising a resist material coupled to a spin-on composition formed from:
at least one inorganic-based compound,
at least one organic absorbing compound, and
at least one pH tuning agent comprising a base.

28. The layered material of claim 27, further comprising a coating solution comprising the spin-on composition and a solvent or a solvent mixture coupled to the resist material.

29. The layered material of claim 28, wherein the resist material comprises a development line that is at an angle of at least 85 degrees with respect to the coating solution.

30. The composition of claim 28, wherein the resist material absorbs light over a wavelength range that comprises 157 nm, 193 nm, 248 nm and 365 nm.

31. The layered material of claim 27, wherein the resist material comprises a development line that is at an angle of at least 85 degrees with respect to the spin-on composition.

* * * * *